(12) United States Patent
Furuyama

(10) Patent No.: US 8,399,894 B2
(45) Date of Patent: *Mar. 19, 2013

(54) SEMICONDUCTOR LIGHT EMITTING DEVICE

(75) Inventor: Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/211,854

(22) Filed: Aug. 17, 2011

(65) Prior Publication Data

US 2011/0297991 A1 Dec. 8, 2011

Related U.S. Application Data

(63) Continuation of application No. 12/631,956, filed on Dec. 7, 2009, now Pat. No. 8,017,956.

(30) Foreign Application Priority Data

Jan. 13, 2009 (JP) ................................. 2009-005140

(51) Int. Cl.
*H01L 21/00* (2006.01)
(52) U.S. Cl. ..... 257/89; 257/92; 257/481; 257/E21.305; 257/E21.582; 257/E27.111
(58) Field of Classification Search ............ 257/88–92, 257/118, 481, E21.305, 582, 27.111, 33.004, 257/51.019
See application file for complete search history.

(56) References Cited

U.S. PATENT DOCUMENTS

| | | |
|---|---|---|
| 6,168,851 B1 | 1/2001 | Kubota |
| 6,249,370 B1 | 6/2001 | Takeuchi et al. |
| 6,268,092 B1 | 7/2001 | Akashi et al. |
| 7,153,361 B2 | 12/2006 | Furuyama |
| 7,173,373 B2 | 2/2007 | Yamada et al. |
| 7,190,115 B2 | 3/2007 | Tsuchiya et al. |
| 7,314,785 B2 * | 1/2008 | Yamazaki et al. ............ 438/149 |
| 7,416,977 B2 | 8/2008 | Fukuchi et al. |
| 7,479,188 B2 | 1/2009 | Yao et al. |
| 7,733,441 B2 | 6/2010 | Seo et al. |
| 7,741,769 B2 | 6/2010 | Hayashi |
| 7,745,993 B2 | 6/2010 | Fukunaga et al. |
| 7,868,543 B2 | 1/2011 | Kobayashi |

(Continued)

FOREIGN PATENT DOCUMENTS

| | | |
|---|---|---|
| JP | 2004-284831 | 10/2004 |
| JP | 2007-49019 | 2/2007 |

OTHER PUBLICATIONS

Y. Shimooka et al., "Robust Hermetic Wafer Level Thin-Film Encapsulation Technology for Stacked MEMS/IC Package", 2008 Electronic Components and Technology Conference, 3 pages.

(Continued)

*Primary Examiner* — Michael Lebentritt
(74) *Attorney, Agent, or Firm* — Oblon, Spivak, McClelland, Maier & Neustadt, L.L.P.

(57) ABSTRACT

A wiring electrode is provided on a mount substrate. A light emitting element is provided on the wiring electrode to connect electrically with the wiring electrode and is configured to emit a blue to ultraviolet light. A reflective film is provided above the light emitting element to cover the light emitting element so that a space is interposed between the reflective film and the light emitting element. The reflective film is capable of transmitting the blue to ultraviolet light. A fluorescent material layer is provided above the light emitting element to cover the light emitting element so that the reflective film is located between the fluorescent material layer and the light emitting element. A light from the fluorescent material layer is reflected by the reflective film.

20 Claims, 15 Drawing Sheets

U.S. PATENT DOCUMENTS

| | | | |
|---|---|---|---|
| 2006/0006794 A1* | 1/2006 | Sakakura et al. | 313/503 |
| 2008/0165315 A1* | 7/2008 | Nishida et al. | 349/137 |
| 2008/0252207 A1* | 10/2008 | Yamazaki et al. | 313/504 |
| 2009/0224245 A1* | 9/2009 | Umezaki | 257/59 |
| 2009/0269871 A1* | 10/2009 | Yamazaki et al. | 438/29 |

OTHER PUBLICATIONS

Mamoru Miyachi et al., "GaN-based laser diodes transferred onto a GaAs substrate", Pioneer R&D vol. 12, No. 3, 2002, 3 pages.

Japanese Office Action issued Aug. 24, 2012, in Patent Application No. 2009-005140 (with English-language translation).

* cited by examiner

SEMICONDUCTOR LIGHT EMITTING DEVICE

CROSS REFERENCE TO RELATED APPLICATION

This application is a continuation of and claims the benefit of priority under 35 U.S.C. §120 from U.S. Ser. No. 12/631,956 filed Dec. 7, 2009, and claims the benefit of priority under 35 U.S.C. §119 from Japanese Patent Application No. 2009-5140 filed Jan. 13, 2009, the entire contents of each of which are incorporated herein by reference.

BACKGROUND

A semiconductor light emitting device can be manufactured by removing a semiconductor substrate from a semiconductor film after crystal growth of the semiconductor film on the semiconductor substrate. Such method is disclosed in JP 2004-284831 or PIONEER R&D, Vol. 12, No. 3, page 77 (2002).

A semiconductor light emitting device may be sealed with resin. A technology for sealing a functional element at an wafer level is disclosed in 2008 Electronic Components & Technology Conference, page 824.

A semiconductor light emitting device, as an illumination in place of an incandescent lamp or a fluorescent lamp, needs a large light output relatively.

Thus, a sealing resin for protecting a semiconductor light emitting device receives heat radiation and light radiation from the semiconductor light emitting device, so the sealing resin may degrade.

In particular, a sealing resin may degrade by heat and ultraviolet light from a light emitting element, as a pumping source, which radiates a blue to an ultraviolet light, in a semiconductor light emitting device of a fluorescent material excitation type.

Accordingly, such a semiconductor light emitting device may not show a high power output or a long life time. Consequently, reduction of a packaging cost may be difficult, in order to obtain a high power output or a long life time.

SUMMARY

An aspect of the invention provides a semiconductor light emitting device including a mount substrate, a wiring electrode provided on the mount substrate, a light emitting element provided above the wiring electrode and electrically connected to the wiring electrode and configured to emit a blue to ultraviolet light, a reflective film provided above the light emitting element to cover the light emitting element so that a space is interposed between the reflective film and the light emitting element, the reflective film being capable of transmitting the blue to ultraviolet light emitted from the light emitting element, a fluorescent material layer provided on an opposite side of the light emitting element so that the reflective film is located between the fluorescent material layer and the light emitting element, a light from the fluorescent material layer being reflected by the reflective film, and a protection film provided above the light emitting element to cover the fluorescent material layer.

Another aspect of the invention provides a semiconductor light emitting device including a mount substrate, a wiring electrode provided on the mount substrate, a light emitting element provided above the wiring electrode and electrically connected to the wiring electrode and configured to emit a blue to ultraviolet light, a reflective film provided above the light emitting element to cover the light emitting element so that a space is interposed between the reflective film and the light emitting element, the reflective film being capable of transmitting the blue to ultraviolet light emitted from the light emitting element, a reinforcement film formed on the reflective film and above the light emitting element to cover the reflective film, a fluorescent material layer provided above the light emitting element to cover the light emitting element so that the reflective film is located between both of the fluorescent material layer and the reinforcement film and the light emitting element, a light from the fluorescent material layer being reflected by the reflective film, and a protection film provided above the light emitting element to cover the fluorescent material layer.

DETAILED DESCRIPTION

Figure 1:
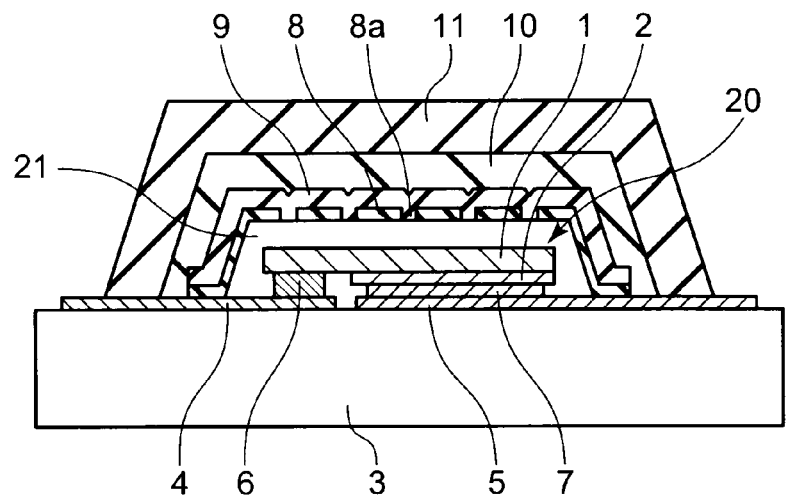
FIG. 1 is a sectional view showing a semiconductor light emitting device according to a first embodiment.

Hereinafter, embodiments of the invention will be described with reference to the drawings. In the drawings, the same reference numerals designates the same or similar portions, respectively.

Figure 2:
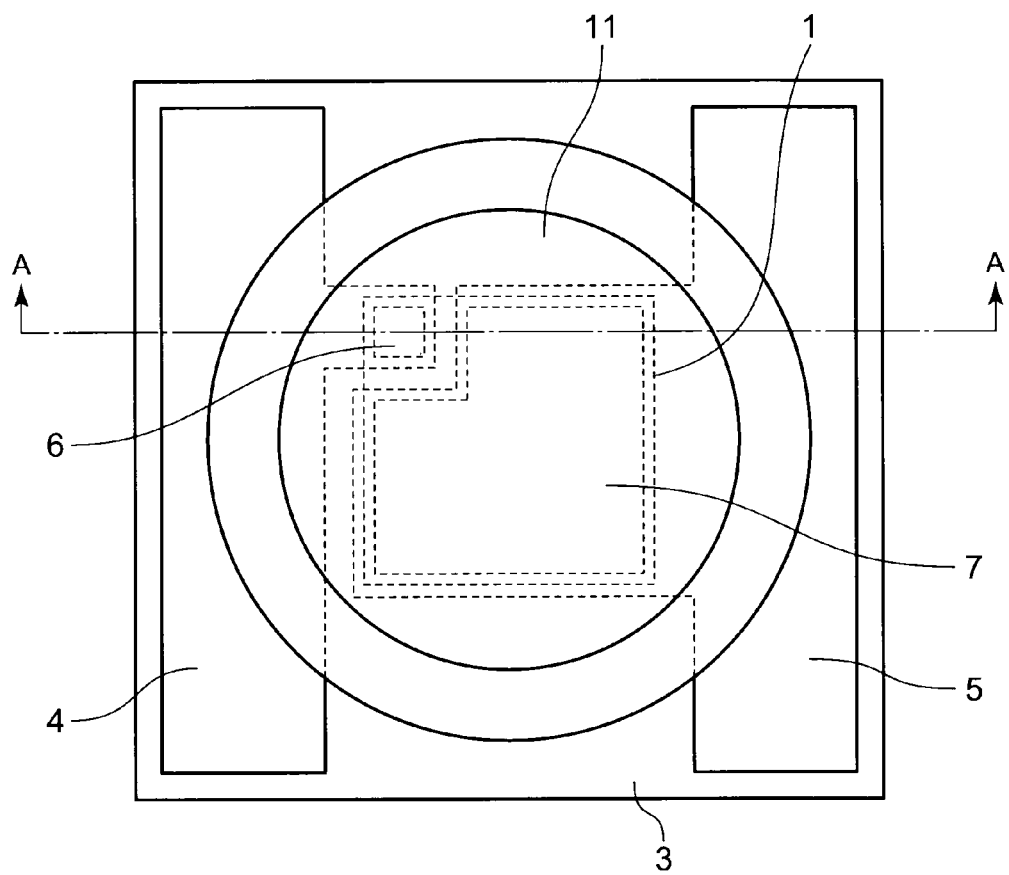
FIG. 2 is a plan view showing the semiconductor light emitting device of the first embodiment.

A semiconductor light emitting device according to a first embodiment will be described with reference to FIG. 1. FIG. 1 is a sectional view showing a semiconductor light emitting device according to the first embodiment. FIG. 2 is a plan view showing the semiconductor light emitting device according to the first embodiment. FIG. 1 shows a section taken along a line A-A of the semiconductor light emitting device shown in FIG. 2.

In FIG. 1, a light emitting diode 20 (hereinafter, referred to as "LED chip") is basically provided with an n-type semiconductor portion 1 and a p-type semiconductor portion 2. A junction portion, which has a p-n junction of the n-type semiconductor portion 1 and the p-type semiconductor portion 2, forms a light emitting portion.

As the n-type semiconductor portion 1 and the p-type semiconductor portion 2, semiconductor portions having a relatively large band gap, such as, GaN can be used respectively. Between the n-type semiconductor portion 1 and the p-type semiconductor portion 2, a semiconductor portion having a relatively small band gap, such as, InGaN can be provided as an active layer. With such a structure, minority carriers injected to the p-n junction are effectively confined in the active layer. Light emission is conducted effectively by recombination of the minority carriers so that the high light emitting efficiency is obtained. In the case that the invention is applied to a semiconductor laser (LD; Laser Diode), a similar structure may be used.

Wiring electrodes 4, 5 are formed apart from each other on a mount substrate 3. A junction metal layer 6 is formed between the wiring electrode 4 and the n-type semiconductor portion 1. A junction metal layer 7 is formed between the wiring electrode 5 and the p-type semiconductor portion 2. A reflective film 8 is provided above the light emitting element and to extends from an upper side to a horizontal side of the LED chip 20, and is separated from the LED chip 20.

The reflective film 8 is dome-shaped and has openings. A side of the reflective film 8 is slanted or curved in a cross sectional view. The reflective film 8 has a property reflecting a light from a fluorescent material layer 10 which will be described in detail below.

Further, the reflective film 8 has a property that the reflection coefficient is small for a wavelength of a light emitted from the LED chip 20. On the other hand, the reflection coefficient is large for the wavelength of a light emitted from the fluorescent material layer 10.

A reinforcement film 9 is formed above the light emitting element and at the back side of the reflective film 8. The reinforcement film 9 reinforces the reflective film 8 to ensure a space 21 between the LED chip 20 and the reflective film 8 and to seal the space 21. The fluorescent material layer 10 is formed to cover the reinforcement film 9. A side of the fluorescent material layer is slanted or curved in a cross sectional view. The fluorescent material layer 10 is excited by the light emitted from the LED chip 20 and emits a light having a wavelength different from that of the light emitted from LED chip 20. A protection film 11 is formed above the light emitting element to cover the fluorescent material layer 10. The protection film 11 has a circle or ellipse shape in a plan view and protects the fluorescent material layer 10. The protection film 11 may be in contact with the fluorescent material layer 8.

A material with high heat conductivity such as Cu, Al, Si, SiC, AlN or $Al_2O_3$ may be used for the mount substrate 3 to dissipate heat generated from the LED chip 20 effectively.

The mount substrate 3 is insulative preferably because the wiring electrodes 4, 5 are provided on the mount substrate 3, according to the embodiment. In the case a conductive substrate is used for the mount substrate 3, a thin insulating film is provided between the conductive substrate and at least one of the wiring electrodes 4, 5. The wiring electrodes 4, 5 may be a Cu film of a 12 μm thickness. A surface of the wiring electrodes 4, 5 may be formed with Ni plating of a 5 μm thickness and the Au plating of 0.2 μm thickness. The junction metal layers 6, 7 are composed of a conductive material such as a solder, an Ag paste or an Au bump respectively. The conductive material may be selected depending on a process for mounting the LED chip 20 such as heat melting, heat curing and ultrasonic connecting.

The reflective film 8 has a function to radiate a light of a wavelength $\lambda_0$ emitted from the LED chip 20 to the fluorescent material layer 10 effectively and to reflect a light emitted from the fluorescent material layer 10. The reflective film 8 serves such that the light of the wavelength $\lambda_0$ passes through the film 8 readily but the light of a wavelength except $\lambda_0$ is reflected.

Accordingly, the light of the wavelength $\lambda_0$ excited by the LED chip 20 is radiated to the fluorescent material layer 10 through the reflective film 8. A light component of the light, which is emitted from the fluorescent material layer 10 and proceeds toward the LED chip 20, is reflected by the reflective film 8 and is outputted to the outside. The ratio of the light, which is dissipated by internal scattering or internal absorption caused in the semiconductor light emitting device, to the light emitted from the fluorescent material film 8 is reduced so that the light emitting efficiency seen from the outside may be high.

Specifically, the thickness $h_2$ of the reflective film 8 is set so as to satisfy the following expression, where the refractive index of the space 21 is $n_1$ ($\approx 1$), the refractive index of the reflective film 8 is $n_2$, the thickness of the reflective film 8 is $h_2$, and the refractive index of the reinforcement film 9 is $n_3$, and where the width $h_1$ of the space 21 and the thickness $h_3$ of the reinforcement film 9 are set sufficiently larger than the wavelength $\lambda_0$ of the LED chip 20.

When $1 < n_2 < n_3$, $$n_2 h_2 = \lambda_0 (1+2m)/4 (m=0,1,2,3,\dots) \tag{1}$$

When $n_2 > n_3$, $$n_2 h_2 = \lambda_0 (1+m)/2 (m=0,1,2,3,\dots) \tag{2}$$

The right side of the expression (1) changes as follows, when the numeral m is increased from zero.

$$\lambda_0/4, \lambda_0 3/4, \lambda_0 5/4, \dots$$

The right side of the expression (2) changes as follows, when the numeral m is increased from zero.

$$\lambda_0/2, \lambda_0 3/2, \dots$$

Figure 3:
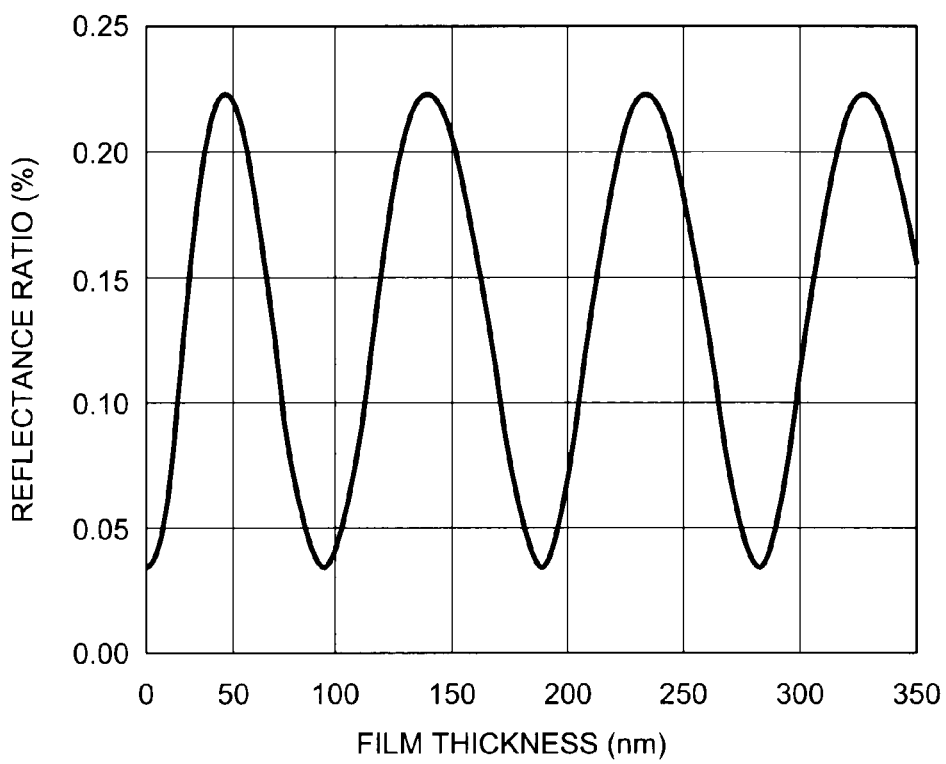
FIG. 3 is a graph showing the relation between the thickness of a fluorescent reflection film of the semiconductor light emitting device according to the first embodiment and the reflection coefficient of a light incident upon the fluorescent reflection film.

In the case that the wavelength $\lambda_0$ of the light emitted from the LED chip 20 is 380 nm, that a silicon oxide film ($SiO_2$, $n_3 \approx 1.46$) is used for the reinforcement film 9 and that a silicon nitride film ($Si_3N_4$, $n_2 \approx 2.02$) is used for the reflective film 8, the dependency of the reflection coefficient of the reflective film 8 on the film thickness $h_2$ is shown in FIG. 3. In FIG. 3, when the film thickness $h_2$ of the reflective film 8 is 94 nm, 188 nm and 282 nm, the reflection coefficient of the reflective film 8 becomes minimum. In the respective cases, $n_2 h_2$ is 190 nm, 380 nm and 570 nm. These values of $n_2 h_2$ correspond to $\lambda_0/2$, $\lambda_0$ and $\lambda_0 3/2$, respectively.

Light propagation can be performed from the silicon oxide film as the reinforcement film 9 to the fluorescent material layer 10 sufficiently. The reason is that the refractive indexes of many of resin materials, which are used to retain a fluorescent material scatteredly, are approximately 1.45.

Figure 4:
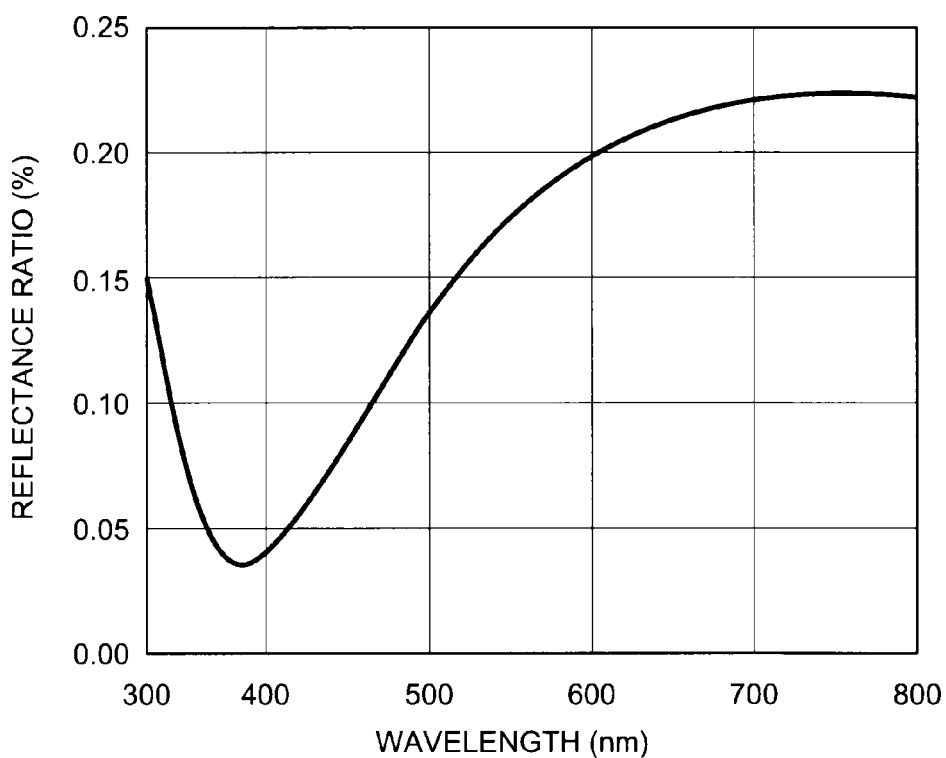
FIGS. 4 to 6 are graphs showing the relations between the wavelength and the reflection coefficient of the incident light respectively.
Figure 5:
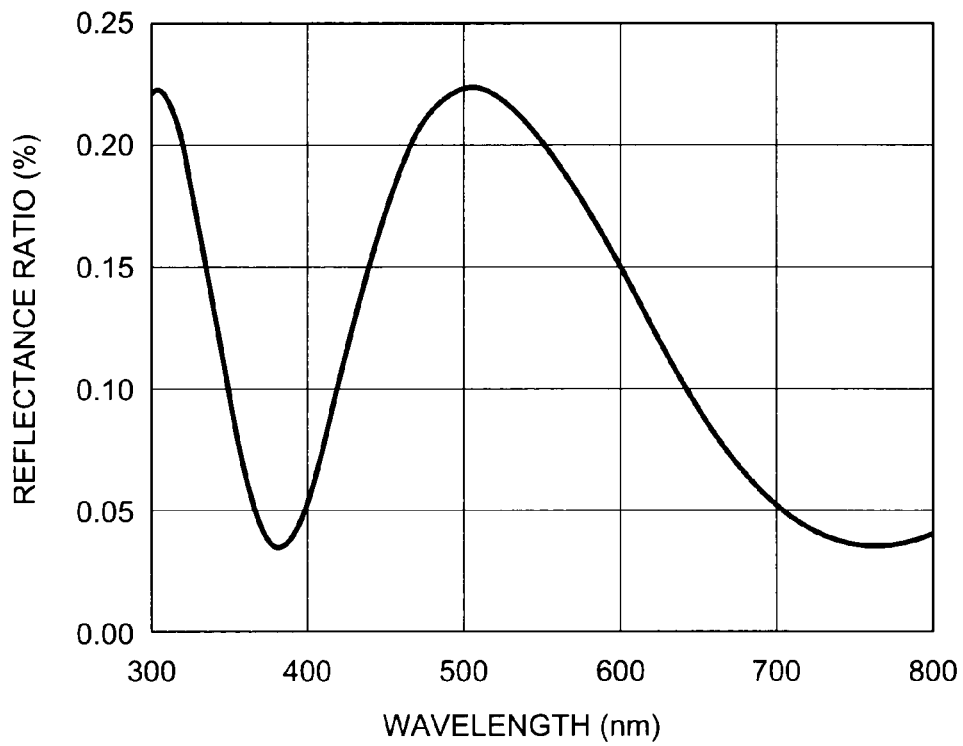
Figure 6:
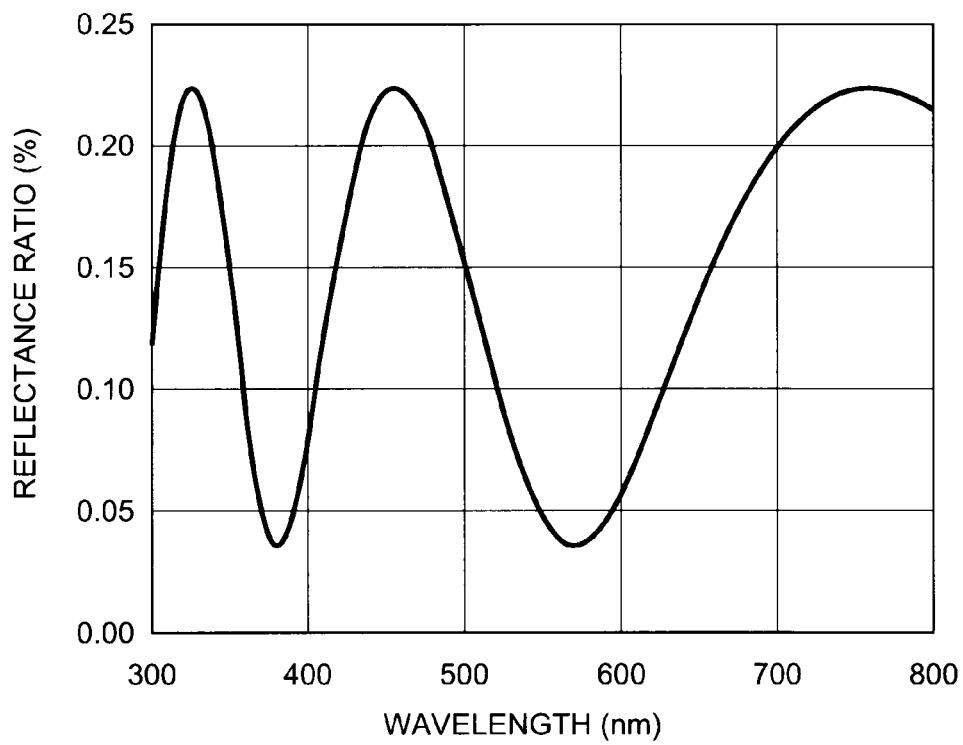

FIGS. 4 to 6 show dependency of the reflection coefficient of the reflective film 8 upon the wavelength of an incident light, when the film thickness $h_2$ of the reflective film 8 is set to make the reflection coefficient minimum.

FIG. 4 shows a dependency of the reflection coefficient of the reflective film 8 upon the wavelength when the film thickness $h_2=94$ nm ($n_2h_2=\lambda_0/2$). The reflection coefficient for the light ($\lambda_0=380$ nm) emitted from the LED chip 20 is approximately 3.5% and corresponds to the reflection coefficient in the case that the light is radiated directly to the reinforcement film 9, the $SiO_2$ film.

On the other hand, the reflective film 8 has a reflection coefficient of 3.5% or more when the reflective film 8 is radiated by the light of a wavelength except the wavelength of the light emitted from the LED chip 20. Accordingly, the light emitted by the fluorescent material layer 10 can be reflected to the outside more efficiently than the case that the reflective film 8 is not used.

The wavelengths of the standard three primary colors are 700 nm for red (R), 546 nm for green (G) and 436 nm for blue (B) respectively. The reflective film 8 indicates reflection coefficients of 22% for red (R), 17% for green (G) and 7% for blue (B), respectively. These reflection coefficients are, approximately, 6 times, 5 times and 2 times larger than those of the case that the reflective film 8 is not used, respectively.

FIG. 5 shows a dependency of the reflection coefficient of the reflective film 8 upon the wavelength when the film thickness $h_2=188$ nm ($n_2h_2=\lambda_0/2$). The reflection coefficient for the light ($\lambda_0=380$ nm) emitted from the LED chip 20 is approximately 3.5%. The reflective film 8 indicates reflection coefficients of 5% for red (R), 21% for green (G) and 14% for blue (B), respectively. As the human feels brightness with the green which is most effectively reflected, the above case is suitable for the purpose being required for brightness, such as an illumination lamp for a bicycle or a flashlight.

FIG. 6 shows a dependency of the reflection coefficient of the reflective film 8 upon the wavelength when the film thickness $h_2=282$ nm ($n_2h_2=\lambda_0 3/2$). The reflection coefficient for the light ($\lambda_0=380$ nm) emitted from the LED chip 20 is approximately 3.5%. The reflective film 8 indicates reflection coefficients of 20% for red (R), 5% for green (G) and 20% for blue (B), respectively.

As the red is much stimulative and is emphasized, the above case is suitable for a warning purpose, such as a guide light or a warning light.

In addition, in the case that the relationship $1<n_2<n_3$ is satisfied, the reflection coefficient of the reflective film 8 can be minimized when the refractive index $n_2$ of the reflective film 8 becomes equal to the square root of $n_1 n_3$ ($n_2=\sqrt{n_1 n_3}$). The reflection coefficient of the reflective film 8 can be approximately 0.005%, for example, in the case that the reinforcement film 9 is $SiO_2$ (the refractive index $n_3=1.46$) and that the refractive index $n_2$ of the reflective film 8 is 1.2 and that the thickness $h_2$ is set to satisfy the relationship $n_2h_2=\lambda_0/4$. Therefore, the light emitted from the LED chip 20 can enter into the $SiO_2$ film composing the reinforcement film 9, with reflecting the light hardly. In this case, the reflection coefficient of the reflective film 8 is 3.5% at a maximum for the light of a wavelength except the wavelength $\lambda_0$ of the light which is emitted from the LED chip 20. This reflection coefficient is larger than that of the wavelength $\lambda_0$ of the emitted light.

As described above, the function of the reflective film 8 does not deteriorate, even if the thickness of the reflective film 8 is set to a thickness except the thickness by which the reflection coefficient becomes minimum for the emitted light from the LED chip 20 as in the case that $n_2h_2=\lambda_0/2$, for example.

For example, when the reflective film 8 is $Si_3N_4$ and the reinforcement film 9 is $SiO_2$, the thickness of the reflective film 8 may be 80 nm which is a little smaller than the thickness to satisfy the relation $n_2h_2=\lambda_0/2$. In this case, the reflection coefficient of the reflective film 8 for the emitted light increases from 3.5% to 8.1%. On the other hand, the reflection coefficients of the lights of the three primary colors become 22.2% for the red (700 nm), 21.1% for the green (546 nm) and 14.5% for the blue (436 nm) respectively so that the reflection coefficients can be averaged totally.

In this case, if the wavelength of the light emitted from the LED chip 20 is set to 325 nm, the condition that $n_2h_2=\lambda_0/2$ is realized, the reflection coefficient of the emitted light can be reduced to approximately 3.5%, and the reflection coefficients of the three primary lights can be as they are described above.

In the above description, the dependency of the reflection coefficient of the reflective film 8 upon the wavelength is described. In addition to such a wavelength dependency of the reflection coefficient of the reflective film 8, the wavelength of the emitted light from the LED chip 20 and the wavelength dependency of the fluorescence efficiency of the fluorescent material of the reflective film 8 are to be optimized in combination for the semiconductor light emitting device.

The embodiment shows an example of the semiconductor light emitting device. The reflective film 8 may have a multilayered structure.

In the embodiment, the light to excite the fluorescent material of reflective film 8 is obtained mainly from the n-type semiconductor portion 1. Generally, the refractive index of the semiconductor material is large, and the emitted light may reflect greatly at the boundary face between the semiconductor material and the air (or vacuum). In the case that the n-type semiconductor portion 1 is formed of GaN and the wavelength of the emitted light is 380 nm, for example, the emitted light is outputted from the n-type semiconductor portion 1 is reflected by about 20%. Therefore, after the LED chip 20 is mounted on the mount substrate 3 or before mounting, an anti-reflection coat (hereinafter, referred to as "AR coat") may be provided on a surface of the LED chip 20 to suppress reflection in order to obtain a high efficiency.

The reflection of the emitted light outputted from the n-type semiconductor portion 1 can be reduced to 0.004% or less by providing an oxide film or a nitride film as the AR coat which has a thickness of 59 nm and a refractive index of 1.6, for example. In addition, the reflection can be suppressed to about 0.9% by providing a $SiO_2$ film with a thickness of 65 nm. Further, the n-type semiconductor portion 1 can be made less reflective by providing fine concavities and convexities smaller than the wavelength of the emission light on a surface of the n-type semiconductor portion 1, which is a light outputting surface.

The fluorescent material for the fluorescent material layer 10 may be $Y_2O_2S$:Eu or $YVO_4$:Eu for the red color, ZnS:Cu, Al or $(Ba,Mg)Al_{10}O_{17}$:Eu,Mn for the green color, and (Ba, Mn)$Al_{10}O_{17}$:Eu or $(Sr,Ca,Ba,Mg)_{10}(PO_4)_6Cl_2$:Eu for the blue color. The fluorescent material layer 10 may be manufactured by the following method. A pasty material is obtained by Fine powder of a fluorescent material is dispersed in a matrix resin to obtain a pasty material. The pasty material is formed in a predetermined shape by a screen printing technology. Further, the pasty material is cured by a process such as a heat treating or a UV curing. the fluorescent material layer 10 is obtained by curing in the method, such as, the heat treating and the UV curing.

Resins of the acrylic series, the polyester series, the silicone series, the epoxy series and the polyimide series and the other various resins may be used for the matrix resin. A resin, which is transparent for a light emitted from the fluorescent material layer 10, may be used for the protection film 11. The resin is an acrylic resin, a silicone resin or an epoxy resin, for example. An inorganic film such as an oxide film or a nitride film can be used for the protective layer 11 As will be described below.

FIGS. 7A to 7I are sectional views showing the steps of a method of manufacturing the semiconductor light emitting device according to the first embodiment.

Figure 7A:
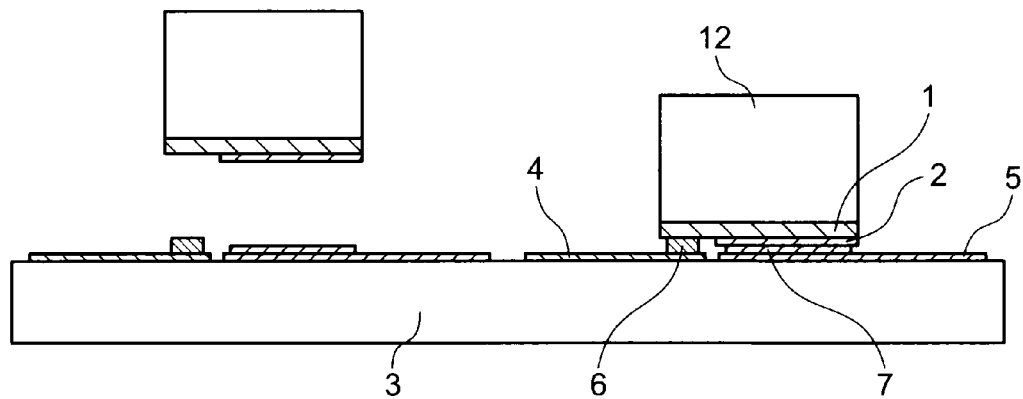
FIGS. 7A to 7I are sectional views showing steps of an example of a method of manufacturing the semiconductor light emitting device according to the first embodiment respectively.

In FIG. 7A, wiring electrodes 4, 5 are formed on a mount substrate 3 in a wafer state by photolithography. Junction metal layers 6, 7 are formed on the wiring electrodes 4, 5 by the photolithography. A substrate 12, which is provided with an n-type semiconductor portion 1 and a p-type semiconductor portion 2, is prepared. The n-type semiconductor portion 1 and the p-type semiconductor portion 2 are bonded to the junction metal layers 6, 7 by the flip chip bonding, respectively. By manufacturing the semiconductor light emitting device while keeping the mount substrate 3 in the wafer state, a pattern processing such as a photolithography or a screen printing may be carried out easily and at the same time.

The flip chip bonding can be done by the following method. Gold (Au) electrodes are formed on the junction metal layers 6, 7. Tin (Sn) electrodes are formed on the n-type semiconductor portion 1 and the p-type semiconductor portion 2. The both electrodes are aligned and are bonded by eutectic AuSn alloying by a heat melting. In addition, the flip chip bonding may be done by the following method. AuSn eutectic solders are plated on both sides of the junction metal layers 6, 7 and the n-type semiconductor portion 1 and the p-type semiconductor portion 2. after aligning the both, a heat melting is performed to bond the both. Instead of an AuSn eutectic solder, other solder materials or a metal powder mixed resin such as a silver (Ag) paste may be used.

Figure 7B:
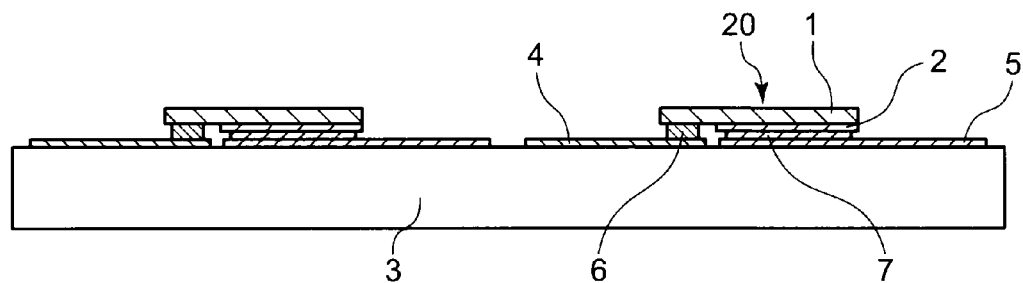

As shown in FIG. 7B, the substrate 12 shown in FIG. 7A is removed. An LED chip 20, which is composed of the n-type semiconductor portion 1 and the p-type semiconductor portion 2, remains. The substrate 12 is removed to avoid light absorption in the substrate 12 and to make the thickness of the LED chip 20 thin. In the embodiment, the LED chip 20 is flip chip mounted so that light is to be taken out from the side of the n-type semiconductor portion 1. By removing the substrate 12, the light absorption by the substrate 12 cam be eliminated. In addition, by removing the substrate 12 to decrease the thickness of the LED chip 20 to a necessity minimum value, a sealing process, which will be described below, can be performed easily.

The substrate 12 shown in FIG. 7A can be removed by using a process, such as polishing, etching or lifting off using a spacer. In the case that the LED chip 20 is made of InGaN/GaN series material and that the substrate 12 is formed of sapphire, the removing process shown in the aforementioned Patent Application Publication 2004-284831 or PIONEER R&D, Vol. 12, No. 3, Page 77 (2002) may be used. In the case that the LED chip 20 is made of an InGaN/GaN series material and that the substrate 12 is made of GaN, the lift off process using a spacer is effective. The thickness of the LED chip 20 can be about 5 to 10 μm by removing the substrate 12.

After the substrate 12 is removed, an AR coat is formed on the whole surface including the surface of the LED chip 20. The AR coat is composed of $SiO_2$. The thickness of the AR coat is 65 nm. The portion of the AR coat, which is formed on the surface except that of the LED chip 20, is removed by a photolithography technology. The AR coat can be formed by depositing a $SiO_2$ film at 250° C. using a plasma CVD (Chemical Vapor Deposition) method, for example. The LED chip 20 is jointed to the junction metal layers 6, 7 by an AuSn solder so that the LED chip 20 can be prevented from being out of alignment which is caused by melting of solder.

Figure 7C:
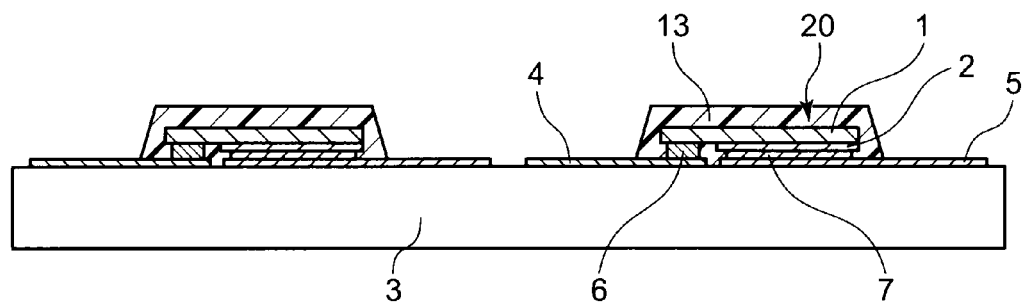

In FIG. 7C, a sacrifice layer 13 is formed so as to form a space 21 shown in FIG. 1. A photo-sensitive polyimide can be used as the sacrifice layer 13. The sacrifice layer 13 is selectively formed in the portion where the space will be formed in a later step, so as to secure a space thickness of 3 to 5 μm from the surface of the n-type semiconductor layer 1.

Figure 7D:
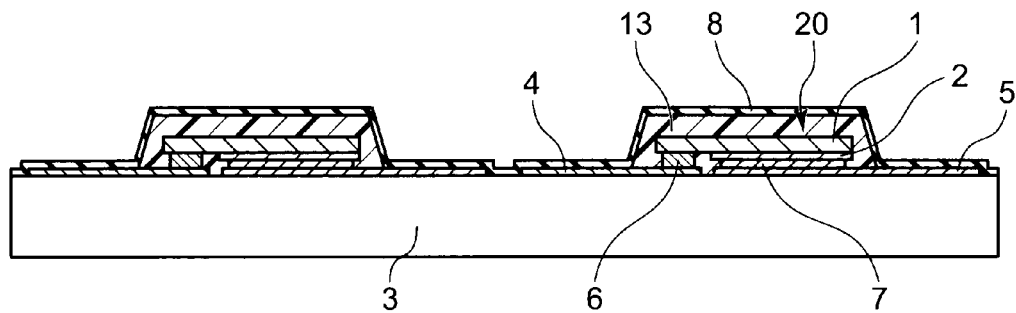

In FIG. 7D, the reflective film 8 is formed on the whole surface including the surface of the sacrifice layer 13. The reflective film 8 is composed of silicon nitride ($Si_3N_4$). The thickness of the reflective film 8 is 94 nm. The reflective film 8 is formed at 250° C. using a plasma CVD method. In the case that the reflective film 8 is thin, a portion of a reinforcement film 9, which will be formed in a later step, may be formed beforehand so as to prevent production of a crack or damage of the reflective film 8 in a later step. In this case, the portion of the reinforcement film 9 can be formed by obtaining a $SiO_2$ film at 250° C. using a plasma CVD process, subsequently after forming the reflective film 8. The thickness of the $SiO_2$ film is 1 μm, for example.

Figure 7E:
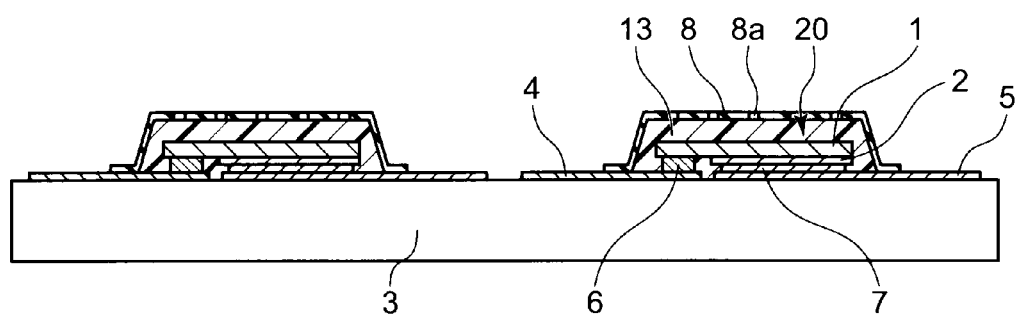

In FIG. 7E, a plurality of openings 8a are provided in the reflective film 8 to remove the sacrifice layer 13 by etch. The openings 8a are formed to have a 2 μm diameter and a 10 μm pitch and are arranged in a grid pattern. The openings 8a are formed by a photolithography and a dry etching which is used widely.

Figure 7F:
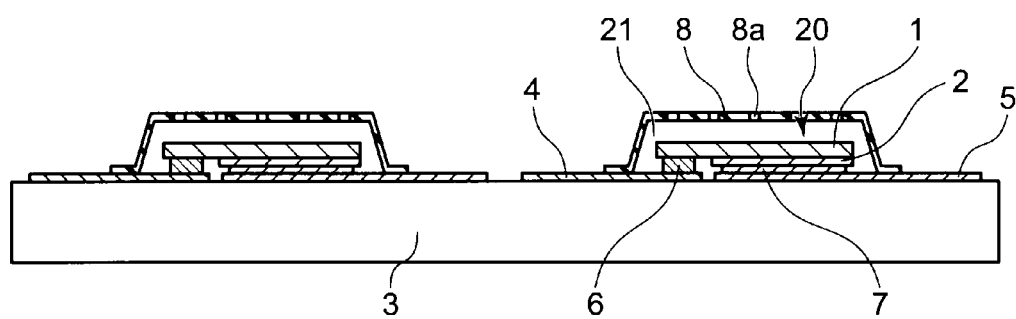

The sacrifice layer 13 is removed as shown in FIG. 7F. The removal of the sacrifice layer 13 is performed by introducing ashing gas through the openings 8a and by ashing the photo-sensitive polyimide composing the sacrifice layer 13. An oxygen ($O_2$) plasma can be used for the ashing. $CF_4$ may be mixed by a few % in the introduced gas to shorten the ashing processing time. In this case, the reflective film 8 and the reinforcement film 9, which may be inorganic films, and the AR coat of the LED chip 20 are not eroded fundamentally. It is desirable to be careful so that the ashing processing does not cause a state near a dry etching by making the mixing ratio of $CF_4$ gas too large.

The reinforcement film 9 is formed in FIG. 7A. The reinforcement film 9 is provided to reinforce the dome shaped reflective film 8 in order to keep the space 21. The reinforcement film 9 seals the openings 8a. The reinforcement film 9 can be made of silicon oxide ($SiO_2$). The thickness of the reinforcement film 9 is 5 μm, for example. The reinforcement film 9 is formed on a whole surface at 250° C. by a plasma CVD method, for example.

In the forming process of the reinforcement film 9, the openings 8a are infilled by $SiO_2$ by the process that the deposition of $SiO_2$ extends from the internal periphery of the openings into the inside in a lateral direction at the opening ends. As a result, the space 21 is blocked off from the outside. At the time, the residual gas of the plasma CVD remains in the space 21. The pressure in the space 21 becomes fundamentally the reaction pressure (several tens to several hundreds Pa) of the plasma CVD that is a reduced pressure atmosphere. The pressure in the space 21 can be set to the atmospheric pressure by using a normal pressure CVD. Preferably, the space 21 is set to a reduced pressure atmosphere so as to prevent that the heat generated from the LED chip 20 transmits to the fluorescent material layer 10 by the convection conduction of the atmospheric gas.

Figure 7G:
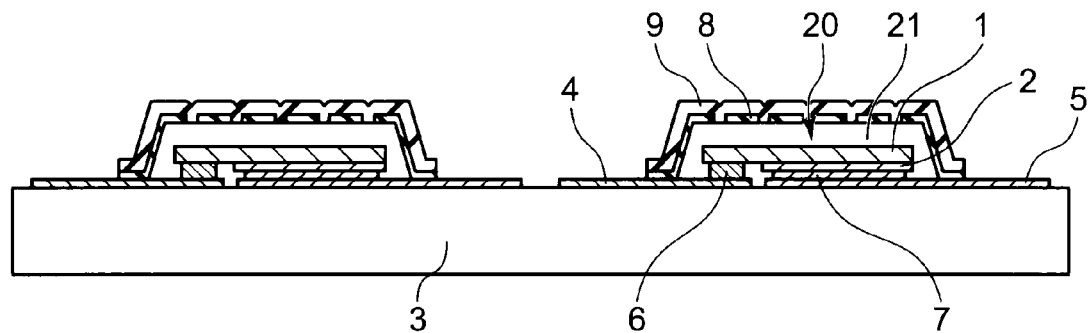

A reinforcement film, which is an insulating film, for example, is unnecessary in portions such as electrode pad regions. Thus, after the reinforcement film 9 is formed, such portions are removed by a photolithography and an etching, as shown in FIG. 7G.

Figure 7H:
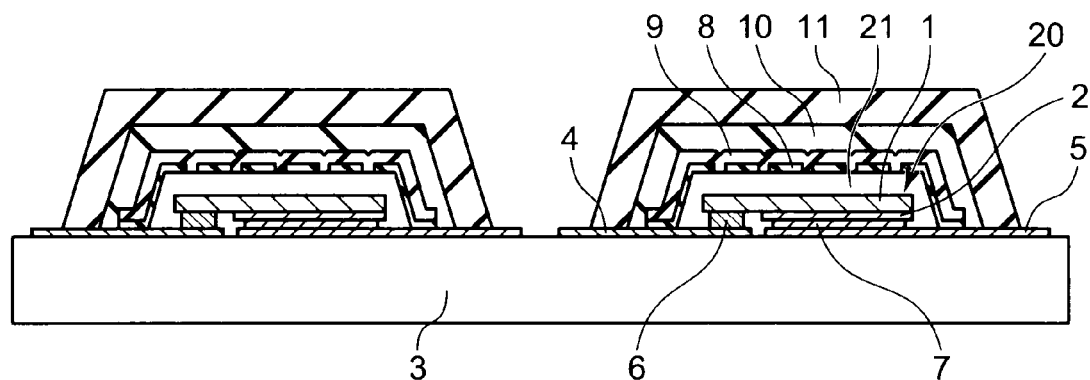
Figure 7I:
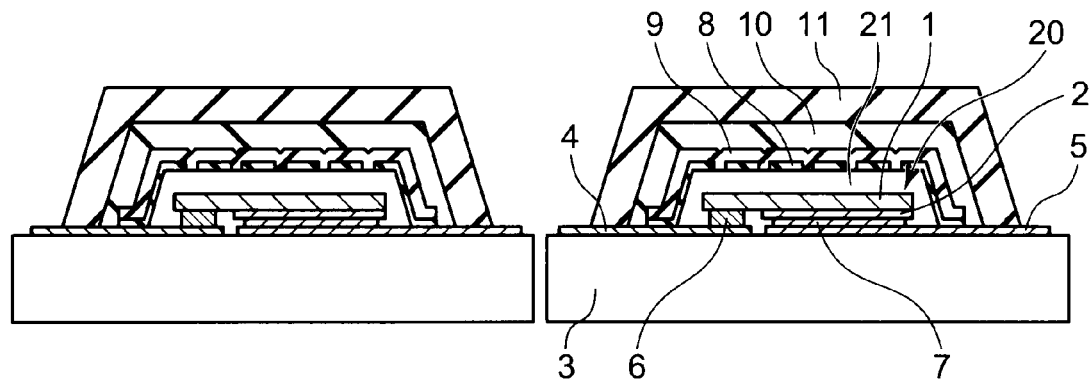

In FIG. 7H, the fluorescent material layer 10 and the protection film 11 are formed. The fluorescent material layer 10 is formed as will be described below. A fluorescent material is dispersed in a resin matrix so that a fluorescent material paste is obtained. The fluorescent material paste is provided on the reinforcement film 9 by a screen printing. The fluorescent material paste is cured by heat treatment so that the fluorescent material layer 10 is obtained. A resin, which is cured by ultraviolet light may be used for the resin matrix. In this case, the fluorescent material paste may be obtained by mixing fluorescent materials of RGB, the three primary colors. The fluorescent material layer 10 may be formed by superimposing fluorescent material pastes of RGB, the three primary colors.

Then, the protection film 11 is formed to cover on the fluorescent material layer 10. In the case that the protection film 11 is resin, the protection film 11 may be formed by a screen printing in the same manner as the fluorescent material layer 10. A photosensitive resin may be formed for the protective layer 11 by a photolithography. In addition, the protection film 11 may be formed by an oxide film, a nitride film, both a resin and an oxide film, or a composite film of a resin and a nitride film.

The mount substrates 3 in the wafer state are separated to make a plurality of semiconductor light emitting devices. Portions of the mount substrates 3 can be separated using dicing which is a semiconductor processing method being widely used.

FIGS. 8A to 8E shows a modification of the manufacturing method shown in FIGS. 7A to 7I. In the modification, removal of a substrate, on which semiconductor portions composing each LED chip are formed, is not performed in the situation where each LED chip is mounted on the mount substrate. In the modification, removal of a substrate, on which a plurality of semiconductor portions composing an LED wafer are formed, is performed in the situation where the substrate is in a wafer state.

Figure 8A:
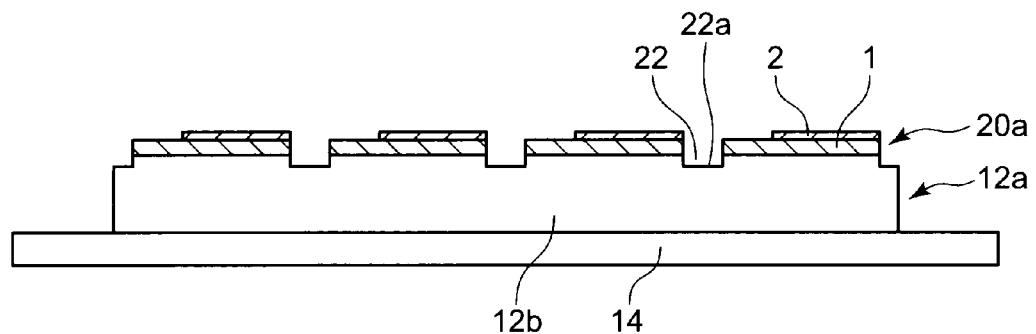
FIGS. 8A to 8E are sectional views showing steps of a modification of the manufacturing method shown in FIGS. 7A to 7I respectively.

As shown in FIG. 8A, an n-type semiconductor portion 1 is formed on the whole surface of a substrate 12b composing an LED wafer 12a. The substrate 12b is composed of sapphire or GaN. The p-type semiconductor portion 2 is formed on the n-type semiconductor portion 1. The substrate 12b is adhered and attached to a dicing tape 14. Dicing grooves 22a are formed at a separation area 22 of the substrate 12b to separate the LED wafer 12a into main bodies 20a of LED in a later step. The dicing grooves 22a have a depth larger than the depth or thickness of the n-type semiconductor portion 1 extending from the surface of the substrate 12b.

At this stage, the LED chips are not separated, but the grooves 22a having part of the depth or thickness of the substrate 12b is formed by dicing, i.e., half-cutting. Instead of the half-cutting by dicing, the grooves may be formed on the substrate 12b by photolithography and etching. After the half-cutting, the dicing tape 14 is removed.

Figure 8B:
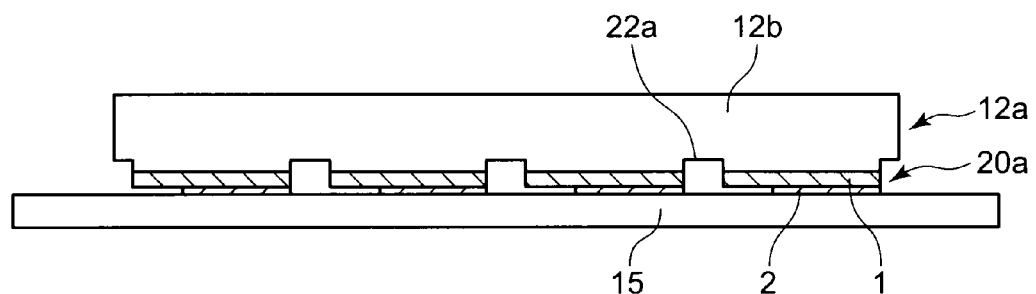
Figure 8C:
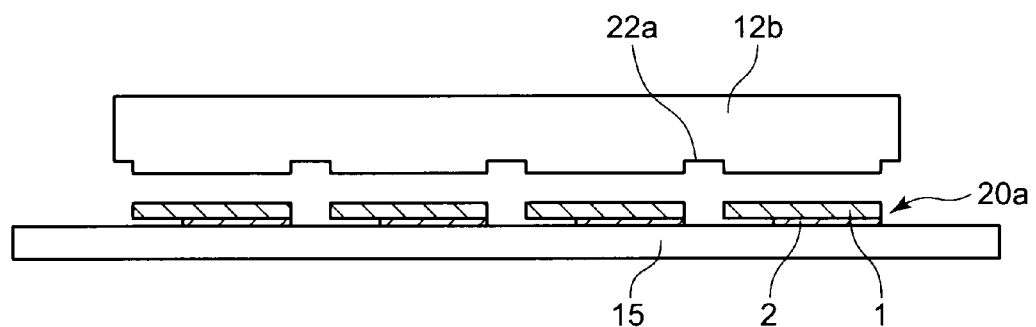

Then, as shown in FIG. 8B, the LED wafer 12a is adhered and attached to a transfer tape 15 so that the surface of the substrate 12b is exposed on the opposite side of the transfer tape 15. Subsequently, as shown in FIG. 8C, the substrate 12b is removed as a whole using a method disclosed in the above-mentioned Patent Application Publication 2004-284831 or PIONEER R&D, Vol. 12, No. 3, Page 77 (2002) or a substrate polishing method, for example. By removing the substrate 12b, the LED wafer 12a is divided into the main bodies 20a of LED to form LED chips, respectively. In addition, a plasma CVD is performed so as to form of a $SiO_2$ film for the AR coat. A tape of the polyimide series may be used for the transfer tape 15 to resist the heat of the plasma CVD.

Figure 8D:
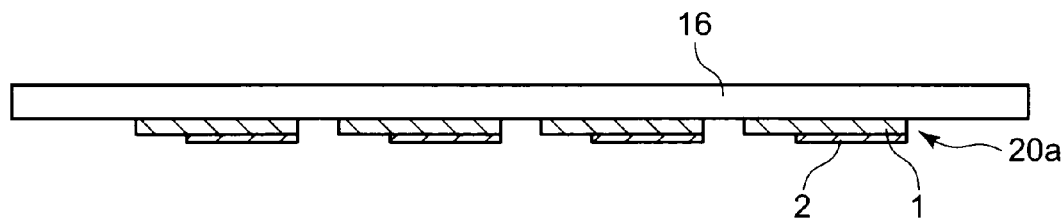

As shown in FIG. 8D, the LED chips are further transferred to another transfer tape 16. The transfer tape 15 is removed so that the surface of the LED chips is exposed on the side of the p-type semiconductor portion 2. A heat removal tape or the UV removal tape may be used for the transfer tape 16.

Figure 8E:
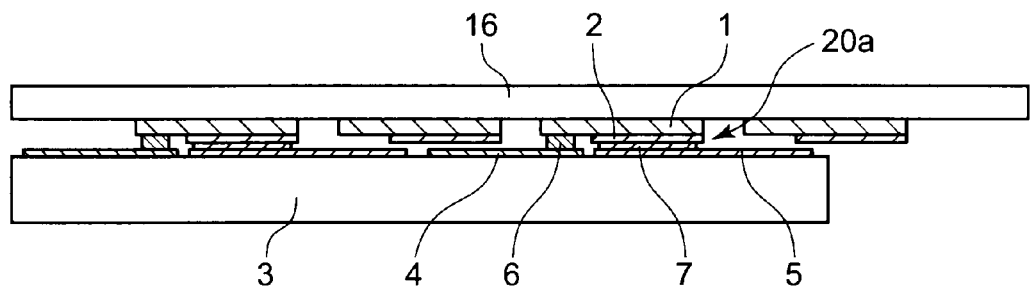

As shown in FIG. 8E, the LED chips adhered and attached to the transfer tape 16 are flip chip mounted on junction electrodes 6, 7 formed on wiring electrodes 4, 5, which are arranged on the mount substrate (wafer) 3.

The LED chips can be transferred to the mount substrate 3 effectively, when an alignment pitch of LED mount portions is set equal to an integral multiple of an alignment pitch of the LED chips, as will be described below in detail. When the pitch of the LED mount portions of the mount substrate 3 is set to two times the alignment pitch of the LED chips, for example, the LED chips can be mounted alternately together. Thus, each plurality of the LED chips may be transferred to each of 4 (four) mount substrates (wafers) together from 1 (one) LED wafer.

A following method may be used to mount the LED chips, which are the main bodies 20a of LED, on the mount substrate 3. Adhesive material layers with a adhesion property, such as silver paste layers, as junction metals 6, 7, are provided on the wiring electrodes 4, 5. The transfer tape 16 is pressed to the mount substrate 3, while the LED chips and the wiring electrodes 4, 5 are aligned with each other.

Figure 9:
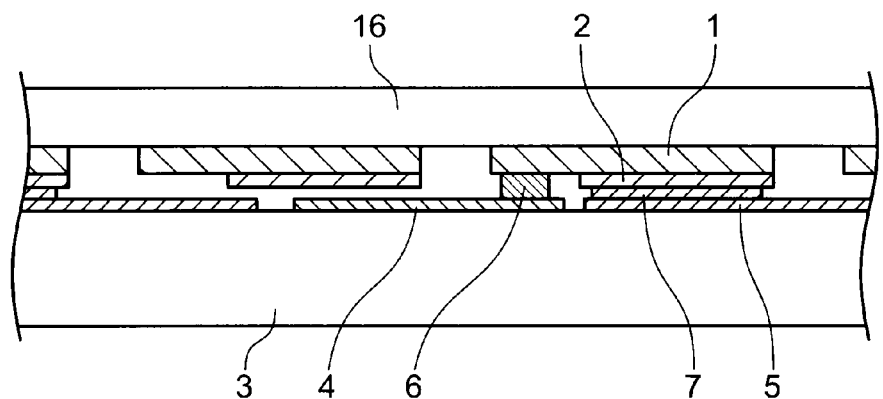
FIG. 9 is a partially enlarged view of the section shown in FIG. 8E.

As shown in FIG. 9, the adhesive material layers are provided so as to be alternately opposite to the LED chips, respectively. Accordingly, by separating the mount substrate 3 from the transfer tape 16, a plurality of the LED chips located at the LED mount portions of the mount substrate 3, which correspond to the junction electrodes 6, 7, are detached by an adhesive force of the adhesive material layers. But the other LED chips remain to adhere and attach to the transfer tape 16, though the mount substrate 3 is separated from the transfer tape 16.

In order to ensure the contact between the adhesive material layers and the LED chips, in the state shown in FIG. 9, the LED chip located above the LED mount portions of the mount substrate 3 may be pressed to the mount substrate 3 by a pin or a press board having a concave portion, from the rear side of the transfer tape 16.

In addition, in order to ensure the detachment of the LED chips, an UV detaching tape or a heat detaching tape may be used as the transfer tape 16. In this case, by selectively performing UV radiation to the transfer tape 16 at the LED mounting portion, or heating through the pin or the press board, detachment of the LED chips can be performed surely.

Instead of using the adhesive material layers described above, solder material layers may be used as junction metals 6, 7. In this case, in the state shown in FIG. 9, portions of the LED chips opposite to the junction metals 6, 7 are selectively soldered by heating the mount substrate 3 to melt the solder material layers. In addition, in the case, the heat detaching tape may be used as the transfer tape 16. In this case, in the state shown in FIG. 9, the mount substrate 3 is heated to the extent that the solder does not melt. The LED chips become easy to be detached from the transfer tape 16 by heating and are selectively detached from the transfer tape 16. Then, the whole of the mount substrate 3 is placed in a reflow furnace. Reflow is performed to solder the portions of the LED chips and the junction metals 6, 7.

FIGS. 10A to 10D are plan views showing a method to transfer the LED chips on a plurality of mount substrates in sequence. FIG. 8E is an enlarged sectional view of a B-B section shown in FIG. 10A. In this case, the alignment pitch of the LED mount portions of the mount substrates is two times the alignment pitch of the main bodies of LED corresponding to the LED chips.

Figure 10A:
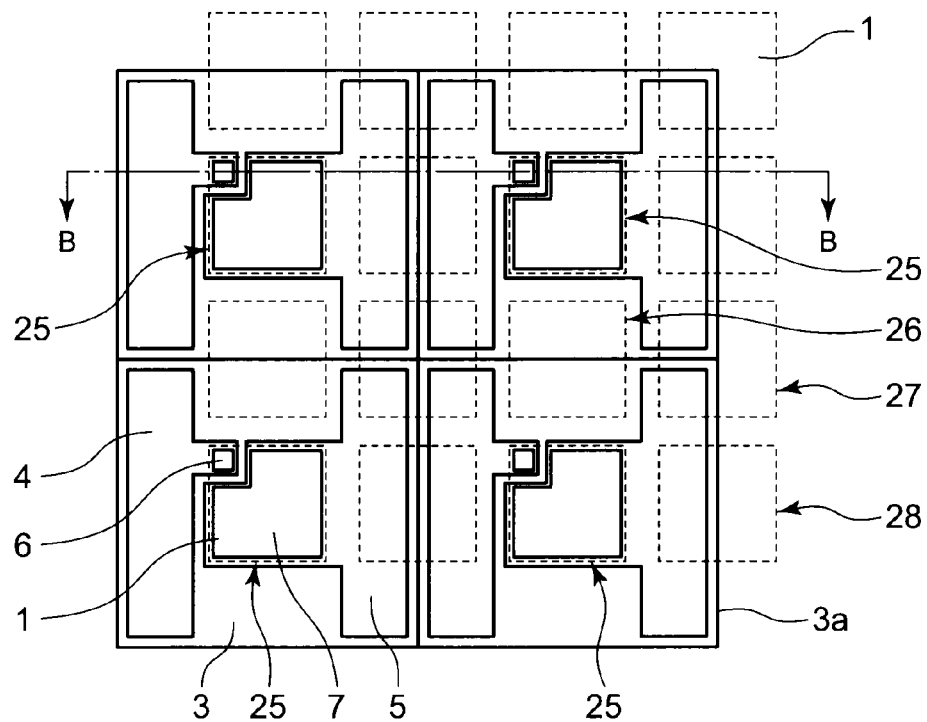
FIG. 10A to FIG. 10D are plan views showing a method of transferring the LED chips in sequence to a plurality of mount substrates.

In FIG. 10A, a first mount substrate 3a is prepared. A plural sets of LED chips, each of which is composed of four adjacent LED chips 25 to 28, are adhered and attached to a transfer tape (not shown). In each set of the LED chips, the LED chip 25 out of the four adjacent LED chips 25 to 28 is transferred to the mount substrate 3a.

Figure 10B:
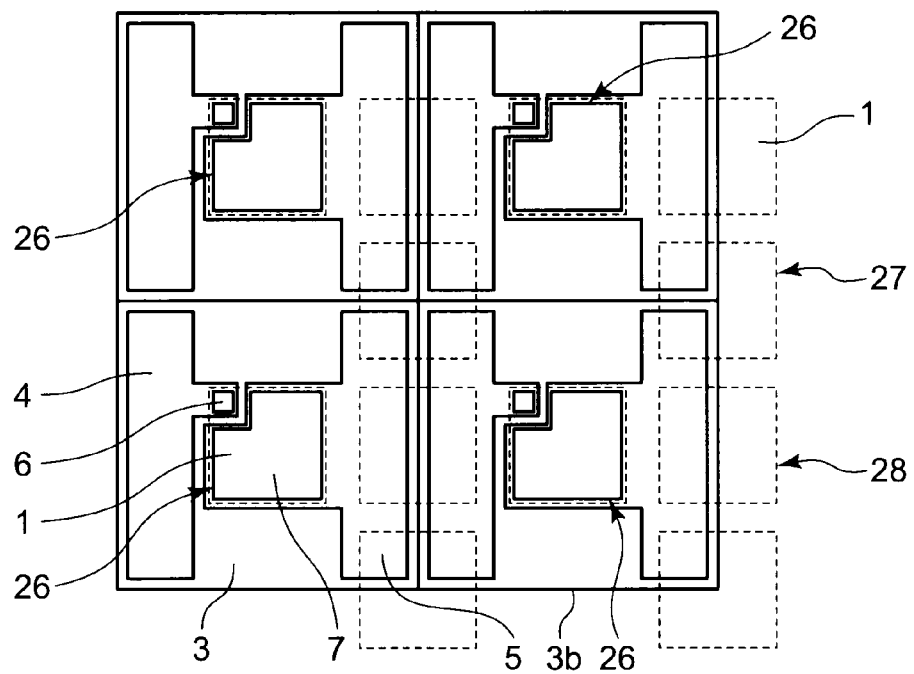

Subsequently, as shown in FIG. 10B, another mount substrate 3b is prepared. In each set of the LED chips, the LED chip 26 out of the three adjacent LED chips 26 to 28 is transferred to the mount substrate 3b.

Figure 10C:
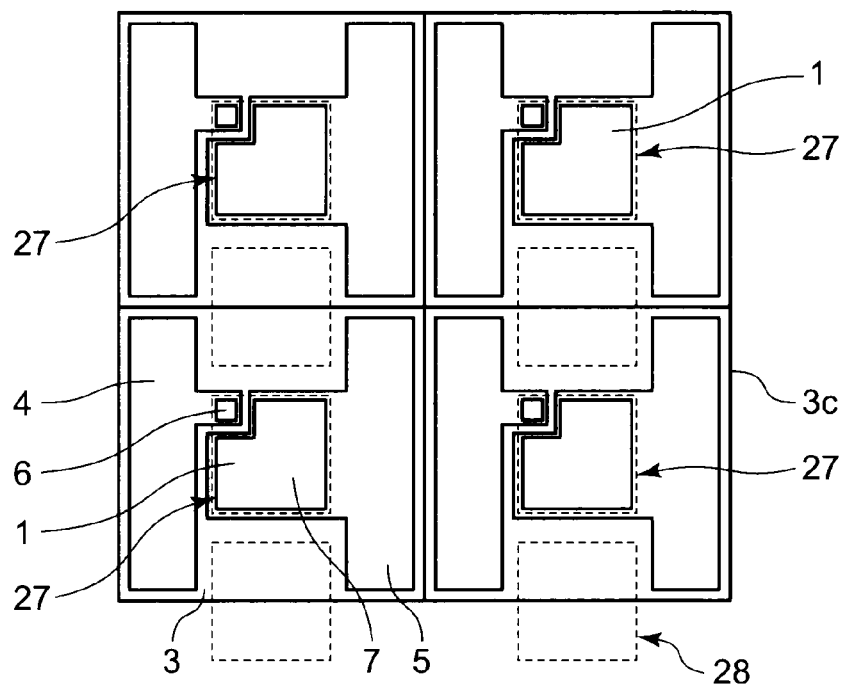

Then, as shown in FIG. 10C, further another mount substrate 3c is prepared. In each set of the LED chips, the one LED chip 27 out of the two adjacent LED chips 27 to 28 is transferred to the mount substrate 3c.

Figure 10D:
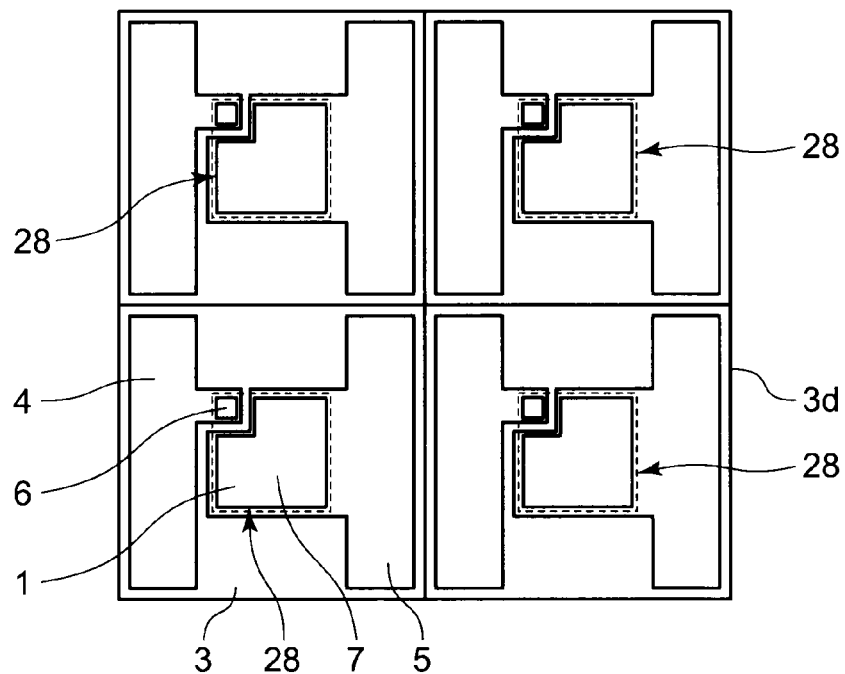

In addition, as shown in FIG. 10D, yet another mount substrate 3d is prepared. In each set of the LED chips, the remaining LED chip 28 is transferred to the mount substrate 3d.

Each one forth of the whole LED chips 25 to 28 made from 1 (one) LED wafer can be sequentially transferred together, by setting the alignment pitch of the four mount substrates 3a to 3d to two times the alignment pitch of the LED chips 25 to 28.

Figure 11:
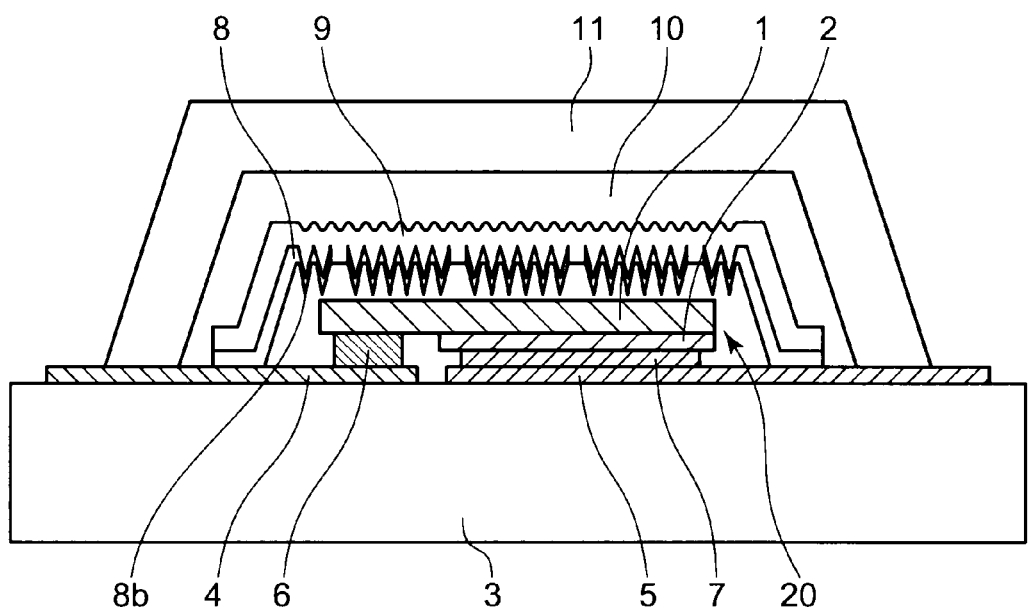
FIG. 11 is a sectional view showing a semiconductor light emitting device according to a second embodiment.

FIG. 11 is a sectional view showing a semiconductor light emitting device according to a second embodiment.

In the embodiment, the reflective film 8 are provided with protrusions and depressions 8b, which enhances the efficiency that the emitted light from the main body of LED is introduced into the fluorescent material layer 10.

FIG. 12A to 12E are sectional views showing steps of a method to manufacture the semiconductor light emitting device according to the second embodiment.

Figure 12A:
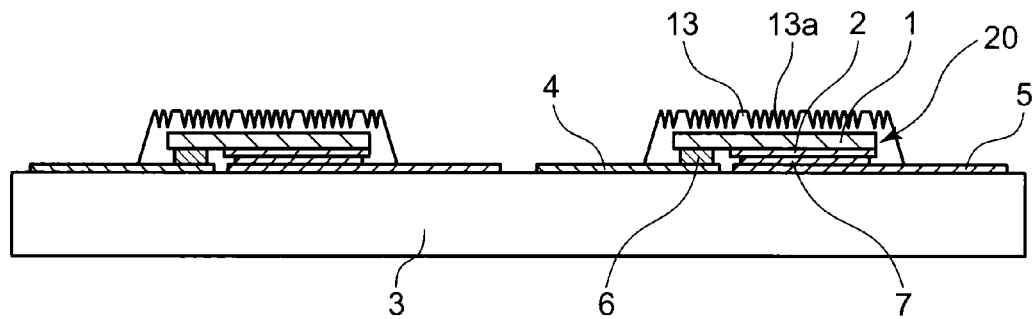
FIGS. 12A to 12E are sectional views showing steps of an example of a method of manufacturing the semiconductor light emitting device according to the second embodiment.

In FIG. 12A, wiring electrodes 4, 5 are formed on a mount substrate 3. Junction metal layers 6, 7 are formed on the wiring electrodes 4, 5, respectively. LED chips 20 are mounted on the junction metal layers 6, 7. Sacrifice layers 13 are formed to configure spaces around the LED chips 20 respectively. The method so far corresponds to the steps shown in FIGS. 7A to 7C. In the step of FIG. 12A, when the sacrifice layers 13 are patterned by photolithography, concavities and convexities 13a are formed on the surface of the sacrifice layer 13 at the same time. The concavities and convexities 13a may be formed by an additional photolithography after the step of FIG. 7C.

Figure 12B:
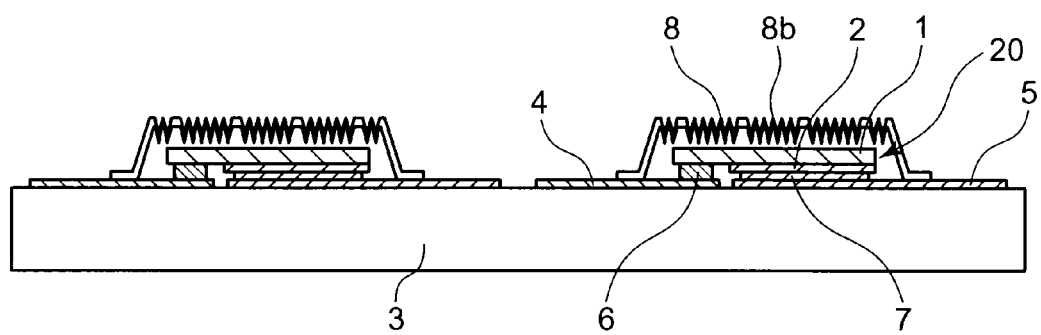
Figure 12C:
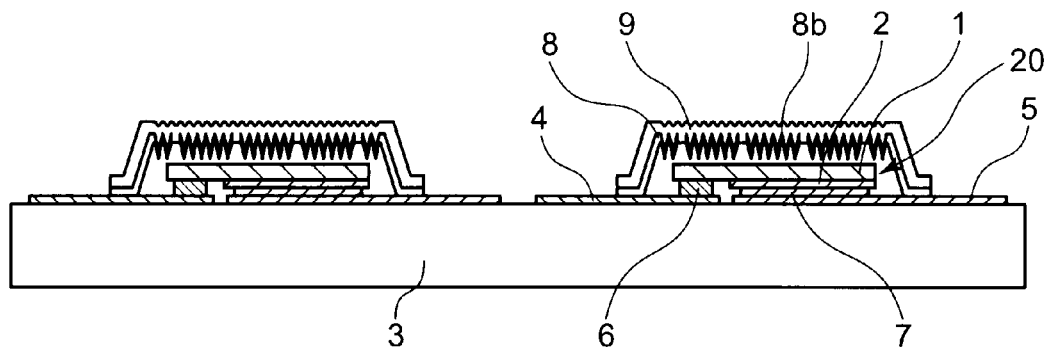
Figure 12D:
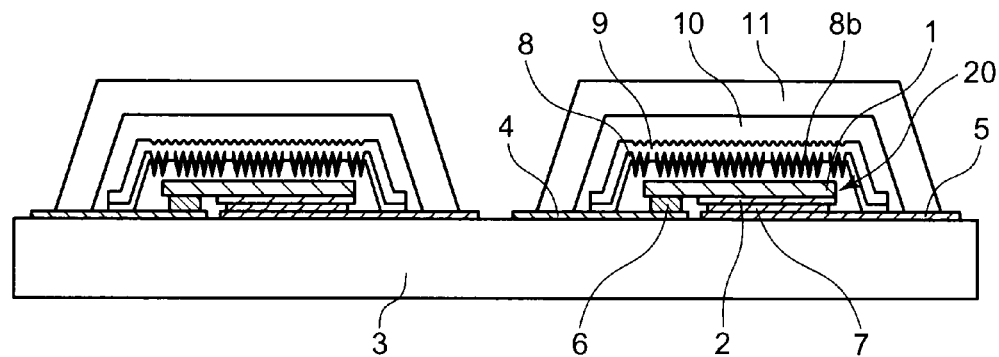
Figure 12E:
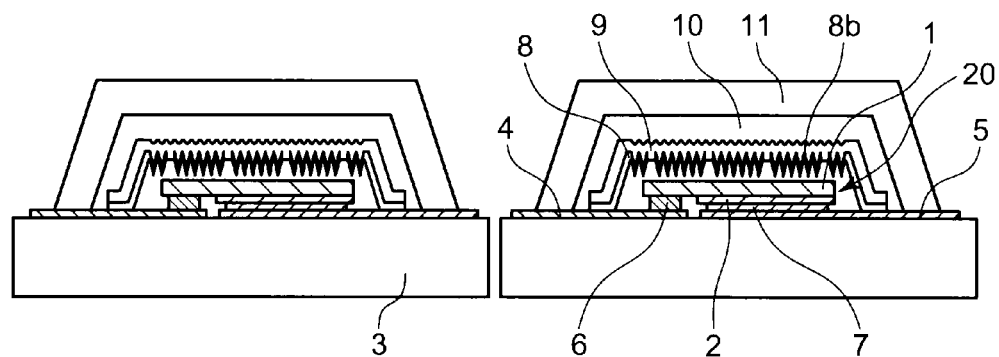

Then, the reflective film 8 is formed as shown in FIG. 12B. At the same time, the protrusions and depressions 8b are formed on the reflective film 8. In addition, in the same manner as the steps shown in FIGS. 7E and 7F, opening portions are formed in the reflective film so that ashing of the sacrifice layers 13 is performed. As shown in FIG. 12C, a reinforcement film 9 is formed. In addition, as shown in FIG. 12D, a fluorescent material layer 10 and a protection film 11 are formed. Then, the mount substrate 3 is divided so that the semiconductor light emitting device shown in FIG. 11 is obtained.

Figure 13:
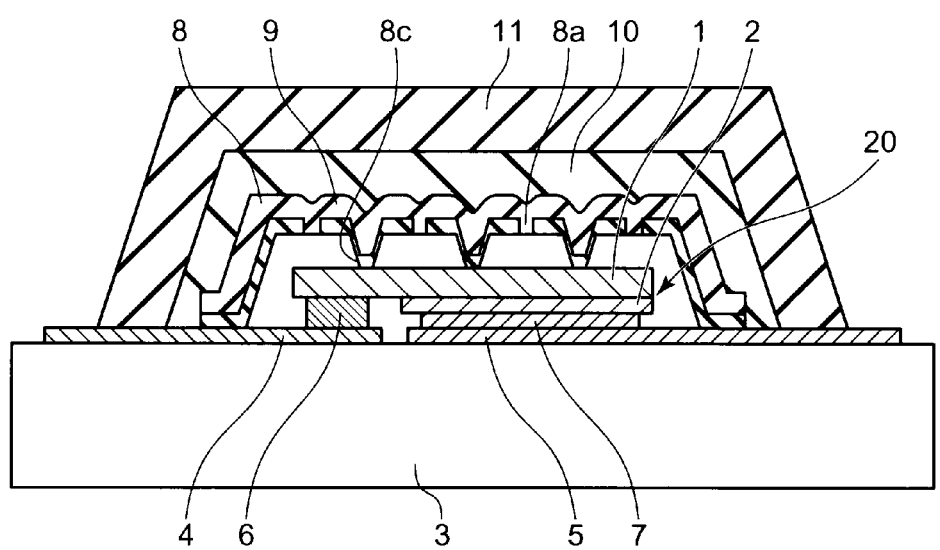
FIG. 13 is a sectional view showing a semiconductor light emitting device according to a modification of the first embodiment.

FIG. 13 is a sectional view showing a semiconductor light emitting device according to a modification of the first embodiment of the invention.

In FIG. 13, portions 8c of the reflective film 8 has a dome shape and contacts with the surface of the LED chip 20. A semiconductor light emitting device can be realized by providing an opening, which extends to the LED chip, in a portion of the sacrifice layer 13. The opening in the sacrifice layer 13 may be formed in a round shape and with a diameter of 5 μm. The portions 8c of the reflective film 8, which contact with the LED chip 20, functions as a support or a column to prevent the reflective film 8 of the dome shape from being crashed by the external pressure.

Figure 14:
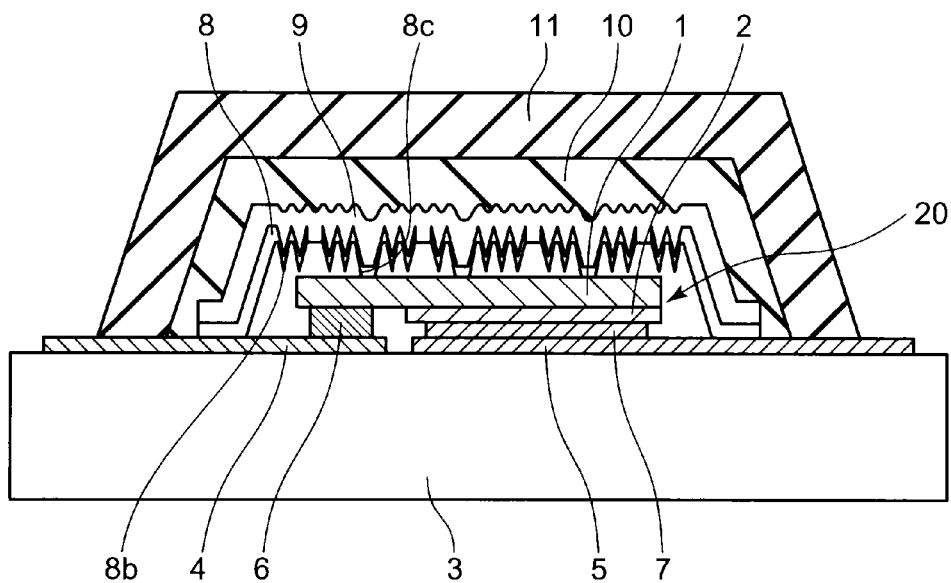
FIG. 14 is a sectional view showing a semiconductor light emitting device according to a modification of the second embodiment.

FIG. 14 shows a cross section of another modification. The modification is obtained by applying the structure shown in FIG. 13 to the second embodiment shown in FIG. 11. As shown in FIG. 14, the portions 8c of the reflective film 8, which contact with the LED chip 20 functions as a support to prevent the dome shaped reflective film 8 from being crashed by the external pressure.

Figure 15:
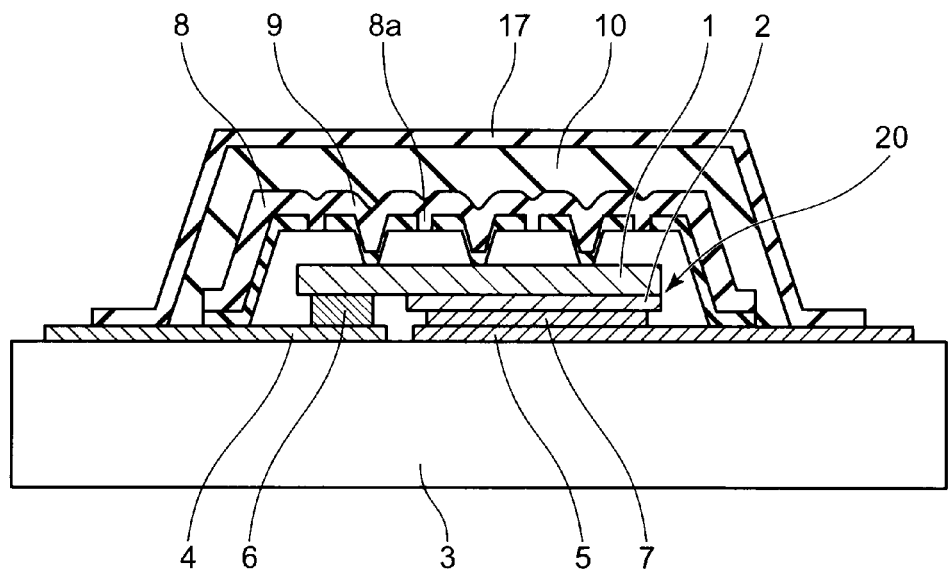
FIG. 15 shows a section of a further modification of the configuration shown in FIG. 13.
Figure 16:
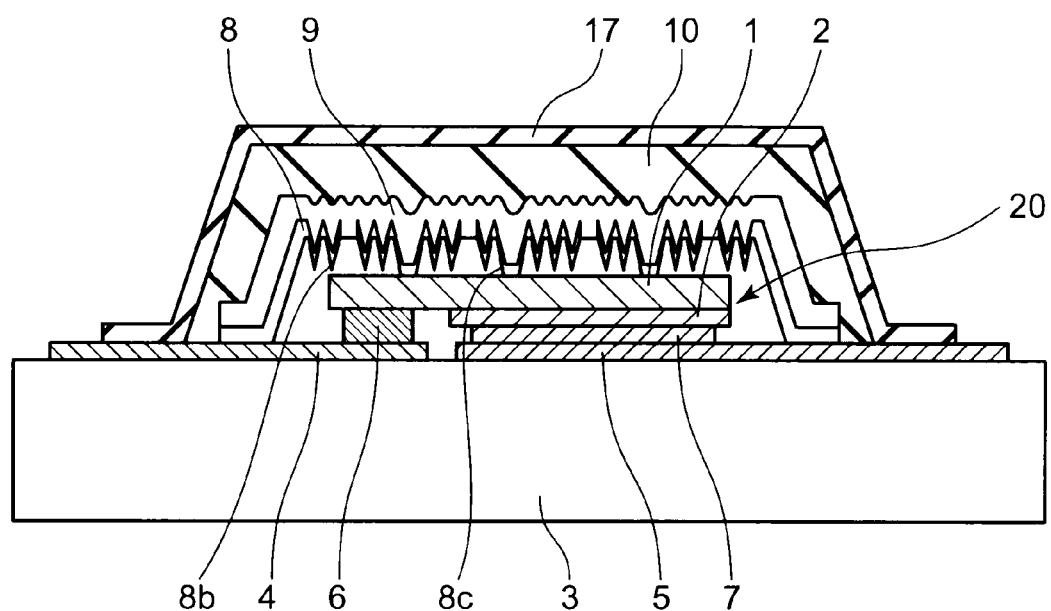
FIG. 16 shows a section of a further modification of the configuration shown in FIG. 14.

The protection film 11 composed of resin can be made thin, as the portions 8c of the reflective film 8 are provided which contact with the LED chip 20. FIG. 15 shows a cross section of a further modification of the configuration shown in FIG. 13. FIG. 16 shows a cross section of a further modification of the configuration shown in FIG. 14.

In FIGS. 15, 16, a thin inorganic film 17 composed of a material such as a $SiO_2$ or $Si_3N_4$ film is used for a protection film to cover the fluorescent material layer 10. Even though the inorganic film 17 is thin, the problem of strength of the inorganic film 17 is small. Use of the thin inorganic film 17 for the protection film prevents deterioration which may be caused by ultraviolet light as in the case that a resin is used for the protection film. In addition, the semiconductor light emitting device having the inorganic film 17 shows a high power output and a long life time.

In the above embodiments and modifications, the reflective film 8 or the fluorescent material layer 10 is formed to cover the LED chip 20 or the main body 20a of LED with the space 21 interposed between the both. The reflective film 8 or the fluorescent material layer 10 covers a wide area ranging from the upward side to the lateral side of the LED chip 20 or the main body 20a of LED. A lateral portion of the reflective film 8 or the fluorescent material layer 10 may be omitted. It is because radiation of the light being emitted from the LED chip 20 or the LED main body 20a is small to the lateral portion.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor light emitting device, comprising:
    a mount substrate;
    a wiring electrode provided on the mount substrate;
    a light emitting element provided above the wiring electrode and electrically connected to the wiring electrode and configured to emit a blue to ultraviolet light;
    a reflective film provided above the light emitting element so that a space is interposed between the reflective film and the light emitting element, the reflective film being capable of transmitting the blue to ultraviolet light emitted from the light emitting element;
    a fluorescent material layer provided so that the reflective film is located between the fluorescent material layer and the light emitting element, a light from the fluorescent material layer being capable of being reflected by the reflective film.

2. The device of claim 1, wherein a plurality of openings is provided on a top surface of the reflective film, and a reinforcement film is provided on the reflective film so as to shut the openings.

3. The device of claim 1, wherein the reflective film has a plurality of protrusions and depressions.

4. The device of claim 3, wherein the plurality of the protrusions and depressions of the reflective film are in contact with a surface of the light emitting element.

5. The device of claim 3, wherein a plurality of protrusions and depressions is provided on the top side of the reflective film, and a side surface of the reflective film is substantially flat.

6. The device of claim 1, further comprising, a low-reflective coat formed on a surface of the light emitting element which is low-reflective to the light emitted from the light emitting element.

7. The device of claim 1, comprising:
a protection film provided above the light emitting element; wherein the reflective film, the fluorescent material layer and the protection film have a circle or ellipse shape in a plan view.

8. The device of claim 1, wherein a plurality of openings are formed in the reflective film.

9. The device of claim 8, comprising:
a protection film provided above the light emitting element;
wherein
a part of the fluorescent material layer is provided above the openings of the reflective film; and
the protection film is composed of an inorganic material.

10. The device of claim 1, wherein a portion of the reflective film is in contact with a surface of the light emitting element.

11. The device of claim 1, wherein a portion of the reflective film is in contact with a surface of the light emitting element.

12. The device of in claim 1, wherein a side of the reflective film and a side of the fluorescent material layer are slanted or curved in a cross sectional view.

13. The device of claim 1, wherein the pressure of the space is lower than the atmospheric pressure.

14. The device of claim 1, comprising
a protection film provided above the light emitting element;
wherein the protection film is in contact with the fluorescent material layer.

15. A semiconductor light emitting device, comprising:
a mount substrate;
a wiring electrode provided on the mount substrate;
a light emitting element provided above the wiring electrode and electrically connected to the wiring electrode and configured to emit a blue to ultraviolet light;
a reflective film provided above the light emitting element so that a space is interposed between the reflective film and the light emitting element, the reflective film being capable of transmitting the blue to ultraviolet light emitted from the light emitting element;
a reinforcement film formed on the reflective film and above the light emitting element; and
a fluorescent material layer provided so that the reflective film is located between both of the fluorescent material layer and the reinforcement film and the light emitting element, a light from the fluorescent material layer being capable of being reflected by the reflective film.

16. The device of claim 15, wherein the pressure of the space is lower than the atmospheric pressure.

17. The device of claim 15, wherein a plurality of openings are formed in the reflective film.

18. The device of claim 15, wherein the reflective film has a plurality of notched.

19. The device of claim 15, wherein a thickness $h_2$ of the reflective film is set so as to satisfy the following expression, $n_2 h_2 = \lambda_0 (1+2m)/4$, where a refractive index of the space is $n_1$, a refractive index of the reflective film is $n_2$, a refractive index of the reinforcement film is $n_3$, a wavelength of the light emitting element is $\lambda_0$, m is zero or a positive integer, the refractive index $n_1 \approx 1$, and $1 < n_2 < n_3$.

20. The device of claim 15, wherein a thickness $h_2$ of the reflective film is set so as to satisfy the following expression, $n_2 h_2 = \lambda_0 (1+m)/2$, where a refractive index of the space is $n_1$, a refractive index of the reflective film is $n_2$, a refractive index of the reinforcement film is $n_3$, a wavelength of the light emitting element is $\lambda_0$, m is zero or a positive integer, the refractive index $n_1 \approx 1$, and $n_2 > n_3$.

* * * * *